United States Patent
Jacobson

(10) Patent No.: US 7,480,843 B1
(45) Date of Patent: Jan. 20, 2009

(54) CONFIGURATION ACCESS FROM A BOUNDARY-SCANNABLE DEVICE

(75) Inventor: Neil G. Jacobson, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 295 days.

(21) Appl. No.: 10/955,807

(22) Filed: Sep. 29, 2004

(51) Int. Cl.
G01R 31/28 (2006.01)
(52) U.S. Cl. ........................... 714/725; 714/727
(58) Field of Classification Search ......... 714/724–727, 714/30, 733, 734; 716/4; 326/37–38, 41
See application file for complete search history.

(56) References Cited

U.S. PATENT DOCUMENTS

| | | | | |
|---|---|---|---|---|
| 4,947,357 | A * | 8/1990 | Stewart et al. | 714/726 |
| 5,457,408 | A * | 10/1995 | Leung | 326/38 |
| 5,590,354 | A | 12/1996 | Klapproth et al. | |
| 5,701,308 | A * | 12/1997 | Attaway et al. | 714/740 |
| 5,805,607 | A | 9/1998 | Khu | |
| 5,898,701 | A | 4/1999 | Johnson | |
| 6,044,025 | A | 3/2000 | Lawman | |
| 6,260,139 | B1 | 7/2001 | Alfke | |
| 6,314,550 | B1 * | 11/2001 | Wang et al. | 716/17 |
| 6,389,558 | B1 | 5/2002 | Herrmann et al. | |
| 6,389,565 | B2 | 5/2002 | Ryan et al. | |
| 6,553,523 | B1 | 4/2003 | Lindholm et al. | |
| 6,594,802 | B1 * | 7/2003 | Ricchetti et al. | 716/4 |
| 6,629,311 | B1 | 9/2003 | Turner et al. | |
| 6,654,920 | B1 * | 11/2003 | Hetherington et al. | 714/733 |
| 6,704,889 | B2 | 3/2004 | Veenstra et al. | |
| 6,748,456 | B1 | 6/2004 | Stanton et al. | |
| 6,800,884 | B1 | 10/2004 | Feng et al. | |
| 6,826,100 | B2 * | 11/2004 | Ellis et al. | 365/201 |
| 6,870,393 | B2 * | 3/2005 | Agarwal | 326/38 |
| 6,920,627 | B2 | 7/2005 | Blodget et al. | |
| 6,925,583 | B1 * | 8/2005 | Khu et al. | 714/30 |
| 6,948,147 | B1 * | 9/2005 | New et al. | 716/16 |
| 7,143,295 | B1 * | 11/2006 | Trimberger | 713/189 |
| 7,155,370 | B2 * | 12/2006 | Nejedlo | 702/186 |
| 7,159,046 | B2 * | 1/2007 | Mulla et al. | 710/9 |
| 7,171,599 | B2 * | 1/2007 | Agarwal | 714/725 |
| 7,263,679 | B2 * | 8/2007 | Kuge et al. | 716/10 |
| 2004/0015908 | A1 | 1/2004 | Giel et al. | |

OTHER PUBLICATIONS

U.S. Appl. No. 10/606,728, filed Jun. 26, 2003, Bridgford.
Morgan, Jerry, "Boundary-Scan Testing: Part3: Some Board-Level DFT Guidelines," pp. 1-5, available from Asset InterTech, Inc., 2201 N. Central Expressway, Suite 105, Richardson, TX 75080-2718.

(Continued)

Primary Examiner—Phung M Chung
(74) Attorney, Agent, or Firm—LeRoy D. Maunu

(57) ABSTRACT

Provision of configuration access to a programmable device such as a programmable logic device (PLD) via a boundary-scannable devices. In one embodiment a configuration controller is arranged to transfer configuration data that specify configuration access for the PLD. A scan controller is coupled to the configuration controller and arranged to generate boundary-scan signals responsive to configuration data from the configuration controller. At least one boundary-scannable device has a plurality of boundary-scan pins coupled to the scan controller, and a PLD is coupled to the boundary-scannable device.

20 Claims, 5 Drawing Sheets

OTHER PUBLICATIONS

Choi, Y.-H. et al., "Configuration of a Boundary Scan Chain for Optimal Testing of Clusters of non Boundary Scan Devices,"IEEE, 1992, pp. 13-16, available from Department of Computer Science, University of Minnesota, Minneapolis, MN 55455.

Hansen, Peter, "Testing Conventional Logic And Memory Clusters Using Boundary Scan Devices As Virtual ATE Channels," IEEE, International Test Conference, 1989, paper 7.1, pp. 166-173, Available from Teradyne, Inc., 321 Harrison Avenue, Boston, MA 02118.

Xilinx, Inc., "Virtex-II Platform FPGA Handbook," UG002, Dec. 6, 2000, Ch. 3, pp. 321-376, (v1.0), available from Xilinx, Inc., 2100 Logic Drive, San Jose, CA 95124.

"Introduction to JTAG Boundary Scan", JTAG Boundary Scan Basics White paper, Aug. 21, 2002, 1-6 pages, from http://web.archive.org/web/20020821074054/http://www.enr.udayton.edu/faculty/jloomis.

* cited by examiner

US 7,480,843 B1

CONFIGURATION ACCESS FROM A BOUNDARY-SCANNABLE DEVICE

FIELD OF THE INVENTION

The present invention generally relates to configuring programmable devices.

BACKGROUND

A programmable logic device (PLD), one type of an integrated circuit (IC) having programmable or configurable resources, may be configured to perform a wide variety of functions. The function of a PLD may be configured by loading configuration data into the PLD from an external source. A particular function may be implemented by programming the configurable logic and routing resources of the PLD with configuration data developed and generated for that function.

A PLD supports at least one configuration protocol used to load configuration data into the PLD, and some PLDs may support multiple configuration protocols. A PLD may have a configuration port with dedicated pins for each configuration protocol supported by the PLD. Alternatively, pins may be shared between configuration protocols. Some pins used during configuration may also be used for user-programmed functions after configuration. Certain configuration protocols may provide additional capabilities such as reading the current configuration from the PLD or reconfiguring only a portion of the PLD. A PLD providing multiple configuration protocols provides flexibility by allowing a user to select a configuration protocol according to user requirements.

In many systems one or more PLDs are connected to other devices on a printed circuit board. When the board malfunctions, boundary-scan capabilities of the devices may be used to identify the source of the problem. Part of testing a PLD may involve reconfiguring the device or reading back data from the device. However, reconfiguring the PLD via the normal configuration channel may not be feasible during problem diagnosis. Furthermore, the PLD may have defective boundary-scan logic or the PLD may not have boundary-scan capabilities.

The present invention may address one or more of the above issues.

SUMMARY OF THE INVENTION

The various embodiments of the invention provide configuration access to a programmable device via a boundary-scannable device. In one embodiment, a configuration controller is arranged to transfer configuration data that specify configuration access for an integrated circuit (IC) having programmable logic. A scan controller is coupled to the configuration controller and arranged to generate boundary-scan signals responsive to configuration data from the configuration controller. At least one boundary-scannable device has a plurality of boundary-scan pins coupled to the scan controller, and an IC is coupled to the boundary-scannable device.

In another embodiment, a method for configuration access to an integrated circuit (IC) having programmable logic is provided. The method comprises transferring configuration data specifying the configuration access between a configuration controller and at least one boundary-scannable device having boundary-scan pins, and transferring the configuration data between the boundary-scan pins of the boundary-scannable device and configuration pins of the IC.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

In one embodiment of the invention, configuration access for a PLD is generated by a configuration controller. The data specifying the configuration access is transferred between the configuration controller and a scan controller. The scan controller transports the data specifying the configuration access between the configuration controller and a configuration port of the PLD. The scan controller transports the data specifying the configuration access using boundary-scan of scan devices having boundary-scannable pins that are connected to pins of the configuration port of the PLD. The configuration access may be a read access or a write access. Note that although the examples presented herein describe a PLD, other embodiments may include other types of integrated circuits (ICs) having configurable or programmable logic.

Figure 1:
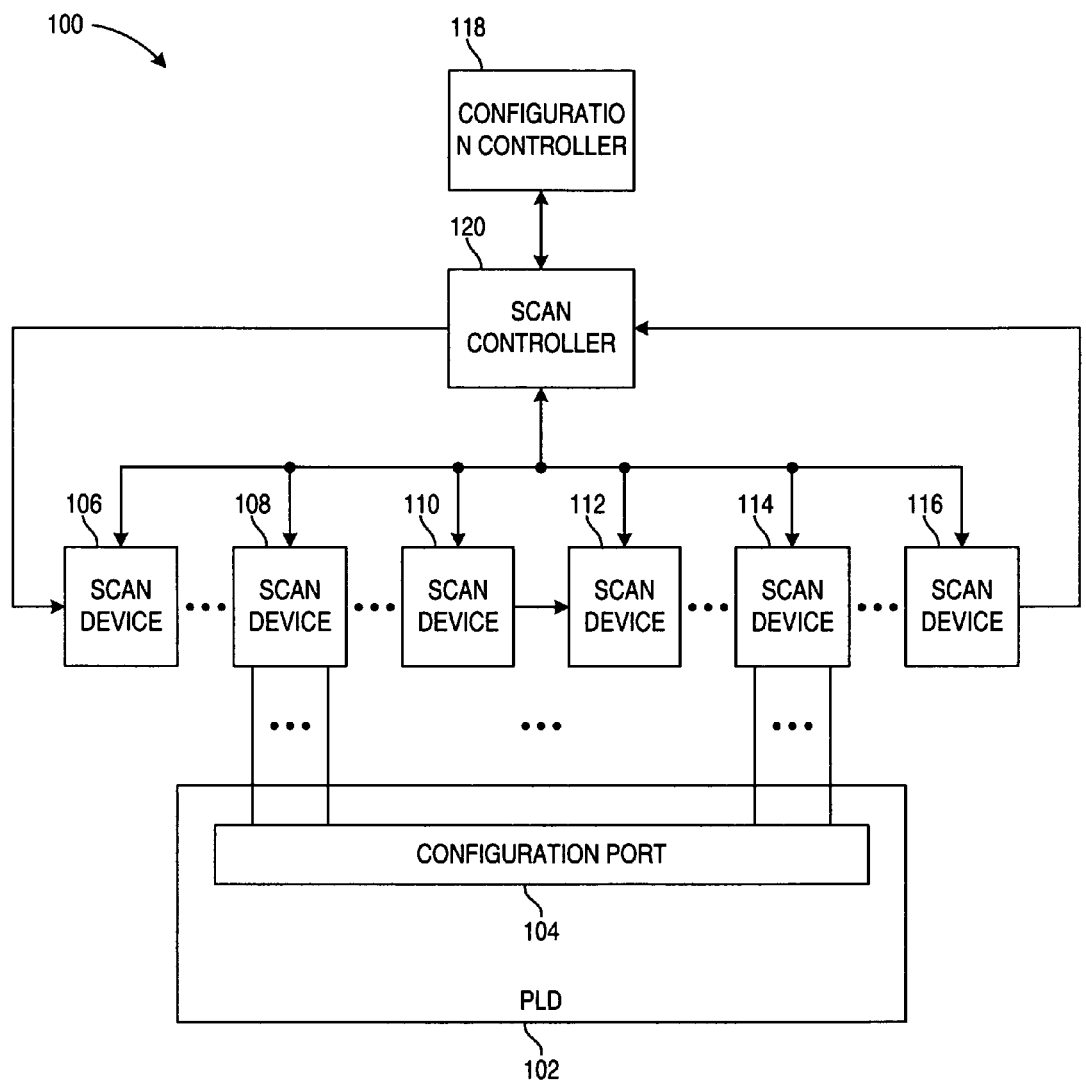
FIG. 1 is a block diagram of an example system for configuration access to a PLD via boundary-scan in accordance with various embodiments of the invention.

FIG. 1 is a block diagram of an example system 100 for configuration access to a PLD 102 via boundary-scan in accordance with various embodiments of the invention. The PLD 102 has a configuration port 104 that is accessed via boundary-scan of one or more scan devices 106, 108, 110, 112, 114, and 116. Those skilled in the art will recognize that boundary-scan capabilities may be implemented in accordance with various standards, for example, IEEE 1149.1, or alternatively with a comparable proprietary protocol.

A configuration controller 118 generates each configuration access to PLD 102. In one embodiment, configuration access may be generated by configuration controller 118 in the format appropriate for the particular type of the configuration port 104, such as a parallel configuration port or a serial configuration port. In another embodiment, the configuration access may be generated in a register transfer format, such as reading the current value of a particular configuration register of the configuration port 104 or writing a particular configuration register with a particular value. Configuration access generated by configuration controller 118 may transfer configuration data specifying the configuration access to the PLD 102 via the access to configuration port 104 provided by scan controller 120 and scan devices 106, 108, 110, 112, 114, and 116.

The combination of the scan controller 120 and the scan devices 106, 108, 110, 112, 114, and 116 transports the specification of the configuration access between the configuration controller 118 and the configuration port 104 of the PLD 102. The combination of the scan controller 120 and the scan devices 106, 108, 110, 112, 114, and 116 provides a transport mechanism that is an alternative to directly connecting the configuration controller 118 to the configuration port 104, or any other configuration port, of the PLD 102.

The scan controller 120 and the scan devices 106, 108, 110, 112, 114, and 116 are connected in a serial scan chain. For a subset of the scan devices, scan devices 108 and 114, for example, scan device pins that are observable and controllable via boundary-scan are connected to the pins of the configuration port 104 of the PLD 102. It will be appreciated that the subset of scan devices having pins connected to configuration port 104 may include all the scan devices. Alternatively, the pins of the configuration port 104 may be connected to pins of only one scan device, for example, a configuration PROM that is a scan device included on a scan chain. It will also be appreciated that there may be a plurality of serial scan chains controlled by a single scan controller 120 with a subset of the pins of the configuration port 104 connected to pins of devices on each serial scan chain. In yet another embodiment, there may be multiple scan controllers, each controlling a number of devices on independent serial scan chains with a subset of pins of the configuration port 104 connected to pins of devices on each serial scan chain. It will be appreciated that advantageously, in systems where pins of one or more existing scan devices are already coupled to the configuration port, the present invention may be implemented with few or no changes to the existing system, and therefore the functionality may be added at little or no additional cost.

Figure 2:
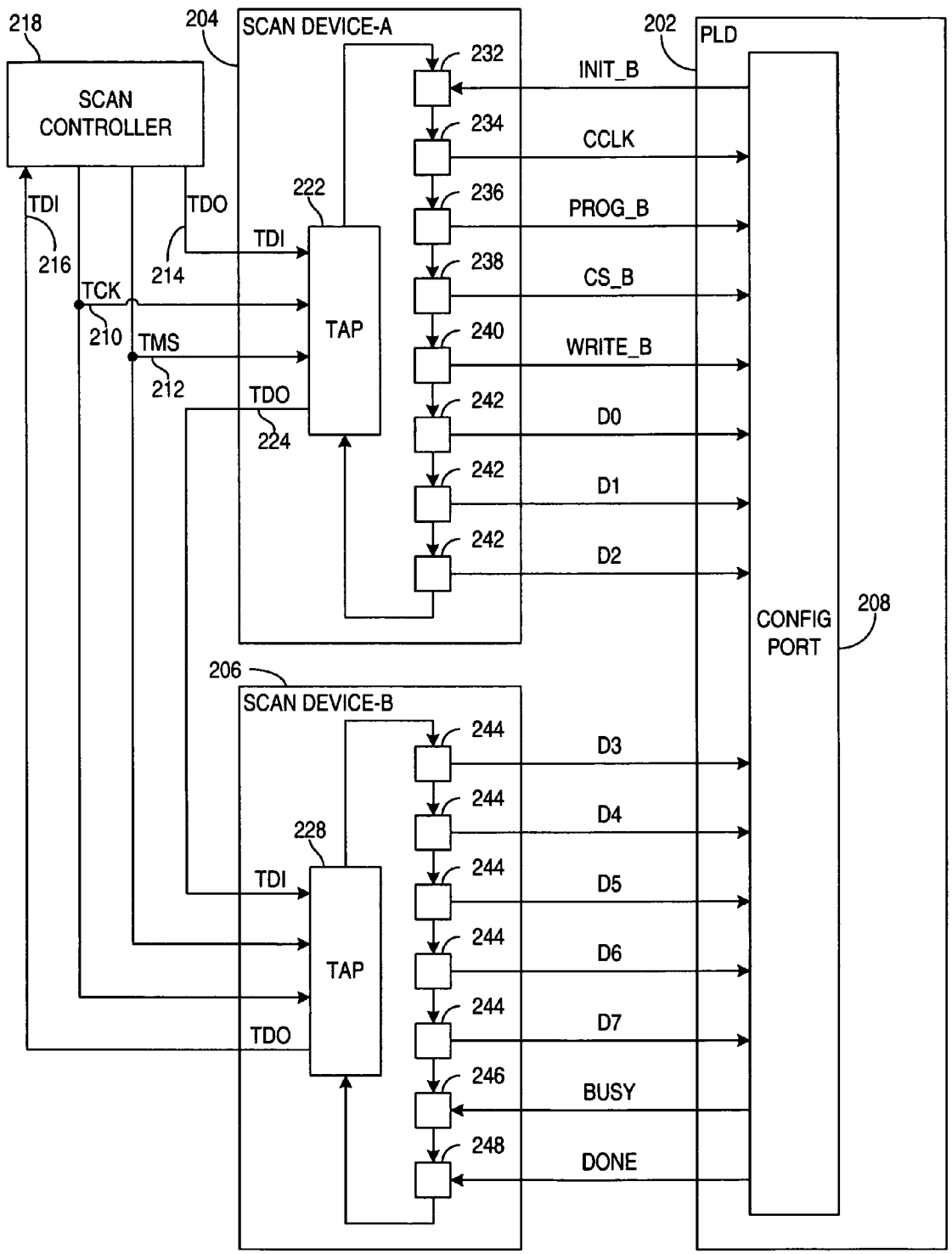
FIG. 2 is block diagram of an example circuit for configuration access to a PLD via boundary-scan in accordance with one or more embodiments of the invention.

FIG. 2 is block diagram of an example circuit for configuration access to a PLD 202 via boundary-scan in accordance with one or more embodiments of the invention. Boundary-scan of scan device-A 204 and scan device-B 206 permits control and observation of a configuration port 208 of PLD 202.

Signals TCK on line 210, TMS on line 212, TDO on line 214, and TDI on line 216 are IEEE standard 1149.1 signals, for example, coupled to scan controller 218. A serial scan chain is produced by connecting TDO output on line 214 from the scan controller 218 to a TDI input of test access port (TAP) 222 of scan device-A 204, connecting TDO output on line 224 from TAP 222 to a TDI input of TAP 228 of scan device-B 206, connecting TDO output from TAP 228 to the TDI input on line 216 of the scan controller 218, and connecting TCK on line 210 and TMS on line 212 in parallel from the scan controller 218 to TAPs 222 and 228. It will be appreciated that additional scan devices may be included anywhere on the scan chain, and that the configuration port 208, shown connected to two scan devices only for illustrative purposes, may be connected to only one scan device, or to more than two scan devices.

The scan operations provided by TAP 222 and TAP 228, which may be enabled by loading particular operation codes in TAP 222 or TAP 228, include, for example, IEEE Standard 1149.1 TAP instructions PRELOAD, EXTEST, and SAMPLE. During a PRELOAD instruction, data from the scan controller 218 may be serially shifted from TDO on line 214 through TAP 222 to input pad 232 and output pads 234, 236, 238, 240, and 242; back to TAP 222; through TDO on line 224 of TAP 222 to TDI of TAP 228; through TAP 228 to output pads 244 and inputs pads 246 and 248; back to TAP 228; and finally through TDO of TAP 228 to TDI on line 216 of the scan controller 218. The PRELOAD instruction may be used to define a respective value to be driven by each of the output pads 234, 236, 238, 240, 242, and 244.

Following a PRELOAD instruction, an EXTEST instruction may be used to cause the respective values to be driven by the output pads 234, 236, 238, 240, 242, and 244. Each pad 232, 234, 236, 238, 240, 242, 244, 246, and 248 of scan devices 204 and 206 may have an associated scannable pin for the corresponding device. The EXTEST instruction also may concurrently sample the current values received at input pads 232, 246, and 248. A serial shift through boundary-scan registers of the pads may be used transfer to the scan controller 218 the values sampled at input pads 232, 246, and 248, and concurrently supply a respective value to be driven by each of the output pads 234, 236, 238, 240, 242, and 244 during a subsequent EXTEST instruction.

The SAMPLE instruction may be used to capture the current values received at input pads 232, 246, and 248. In contrast to EXTEST, which gives complete control of the pins to the boundary-scan register, SAMPLE does not interfere with the basic operation of the device. The SAMPLE instruction is typically used to determine the current state of device pins without disturbing the device state or function or the pin states.

TAP instructions may be used by the scan controller 218 to receive a respective value at each input pad 232, 246, and 248 from the configuration port 208 and to drive a respective value for each output pad 234, 236, 238, 240, 242, and 244 to the configuration port 208. A PRELOAD instruction followed by a series of EXTEST instructions allows the scan controller to repeatedly read the values of the input pads 232, 246, and 248 and concurrent therewith, repeatedly write the values of the output pads 234, 236, 238, 240, 242, and 244.

During power-up of PLD 202, the parallel configuration port 208 may drive a low value to input pad 232 for INIT_B while the PLD 202 is completing an internal power-up sequence, and the configuration port 208 may drive a high value to pad 232 for INIT_B once the internal power-up sequence is complete. The scan controller 218 may be directed by a configuration controller to repeatedly read the values of the input pads until a high value is observed for input pad 232 to synchronize the configuration controller with the power-up of the PLD 202.

One particular configuration access to PLD 202 is the programming of PLD 202 to configure a desired function. The configuration controller may direct the scan controller 218 to begin programming PLD 202 by writing a low value to the output pad 236 for PROG_B while writing default values to the remaining output pads 234, 238, 240, 242, and 244; and then writing a high value to the output pad 236 for PROG_B while again writing default values to the remaining output pads 234, 238, 240, 242, and 244.

To transport each byte of configuration data provided by the configuration controller, the scan controller 218 may perform an EXTEST instruction to read the values for input pad 246 for BUSY and input pad 248 for DONE while providing the byte of configuration data on output pads 242 and 244, an active low value on output pad 238 for CS_B and output pad 240 for WRITE_B, an inactive high value on output pad 236 for PROG_B, and an inactive low value on output pad 234 for CCLK. While the values read for input pads 246 and 248 indicate the configuration port 208 is busy and the configuration of PLD 202 is not done, the scan controller 218 may repeat a similar EXTEST instruction. If the values read for input pads 246 and 248 indicate the configuration port 208 is not busy and the configuration of PLD 202 is not done, the scan controller 218 may complete the transfer by providing the same values for the output pads 236, 238, 240, 242, and 244, and providing an active high value for output pad 234 for CCLK to provide a rising edge for the configuration clock to transfer the byte of configuration data to the configuration port 208 of the PLD 202.

Figure 3:
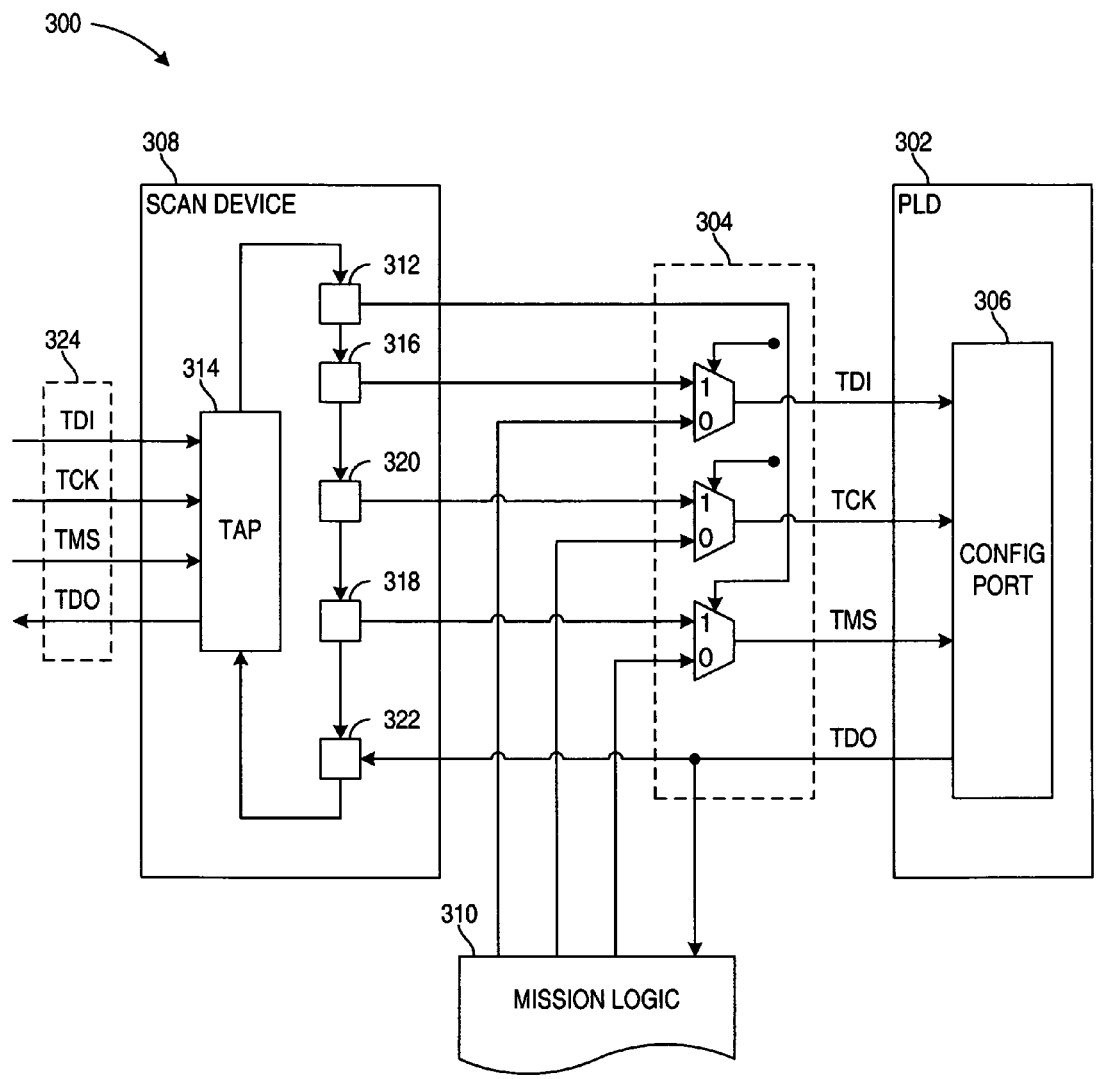
FIG. 3 is a block diagram of an example multiplexer circuit for configuration access to a PLD via boundary-scan in accordance with various embodiments of the invention.

FIG. 3 is a block diagram of an example multiplexer circuit 300 for configuration access to a PLD 302 via boundary-scan in accordance with various embodiments of the invention. The multiplexer logic 304 provides an access path between the configuration port 306 of PLD 302 and a scan device 308.

The multiplexer logic 304 may be inserted into a design otherwise having the serial configuration port 306 of PLD 302 coupled solely to mission logic 310 that does not provide boundary-scan. The multiplexer logic 304 provides an access path between the configuration port 306 and scan device 308 while having an operating mode that does not alter the function of circuit 300. The scan device 308 may be a device added to the circuit 300 to provide the access path, or scan device 308 may be a device already included in circuit 300 that has otherwise unused pins or pins that may be adapted for this use.

When output pad 312 of scan device 308 is driving a value of zero on the associated scannable pin of scan device 308, the function of circuit 300 is not altered by the addition of the multiplexer logic 304. Output pad 312 of scan device 308 may have a power-up reset value of zero. Alternatively, an initial PRELOAD instruction from a scan controller for TAP 314 of scan device 308 may provide a value of zero for output pad 312 and a subsequent EXTEST instruction from the scan controller for TAP 314 may drive the output pad 312 to zero. Note that in some embodiments, the control signal for controlling multiplexer logic 304 may be provided from a source other than pad 312, such as a switch or an external pin.

During scan access to configuration port 306 of PLD 302, a PRELOAD/EXTEST sequence for TAP 314 may be used to provide a value of one for output pad 312 to enable access to the configuration port 306 via boundary-scan of scan device 308. To shift one bit of data for a configuration access into configuration port 306 that is implemented using IEEE 1149.1 protocol, an EXTEST instruction for TAP 314 may provide the bit of data on output pad 316 for TDI, the value appropriate for a data shift state of a TAP internal to configuration port 306 on output pad 318 for TMS, a zero value for the output pad 320 for an inactive TCK, along with the multiplexer logic 304 enable value of one for output pad 312. A second subsequent EXTEST instruction for TAP 314 may provide the same data for output pads 312, 316, and 318 and a value of one for the output pad 320 for TCK to provide an active shift clock transition for the configuration clock.

The second EXTEST instruction for TAP 314 may provide the value received by input pad 322 for TDO to the scan controller. Alternatively, a SAMPLE instruction may be used to obtain the TDO value received by input pad 322. Using a SAMPLE instruction to obtain the TDO value received by input pad 322 may be advantageous in certain scenarios in which it is undesirable to disturb the device function while capturing the value.

The shifting of one bit of data for a configuration access into configuration port 306 requires many bits of data to be shifted by a scan controller into scan device 308 via scan signals 324. Thus, for a configuration controller implemented to connect directly to a configuration port 306 using the IEEE 1149.1 protocol, the scan controller transforms each clock of data transfer from the configuration controller into a series of data transfers via scan signals 324 to transport the clock of data transfer via pads 316, 318, 320, and 322 to configuration port 306.

It will be appreciated that the boundary-scan chain for scan device 308 may have more pads than pads 312, 316, 318, 320, and 322, and that the pads may appear in any arbitrary order on the boundary-scan chain.

Figure 4:
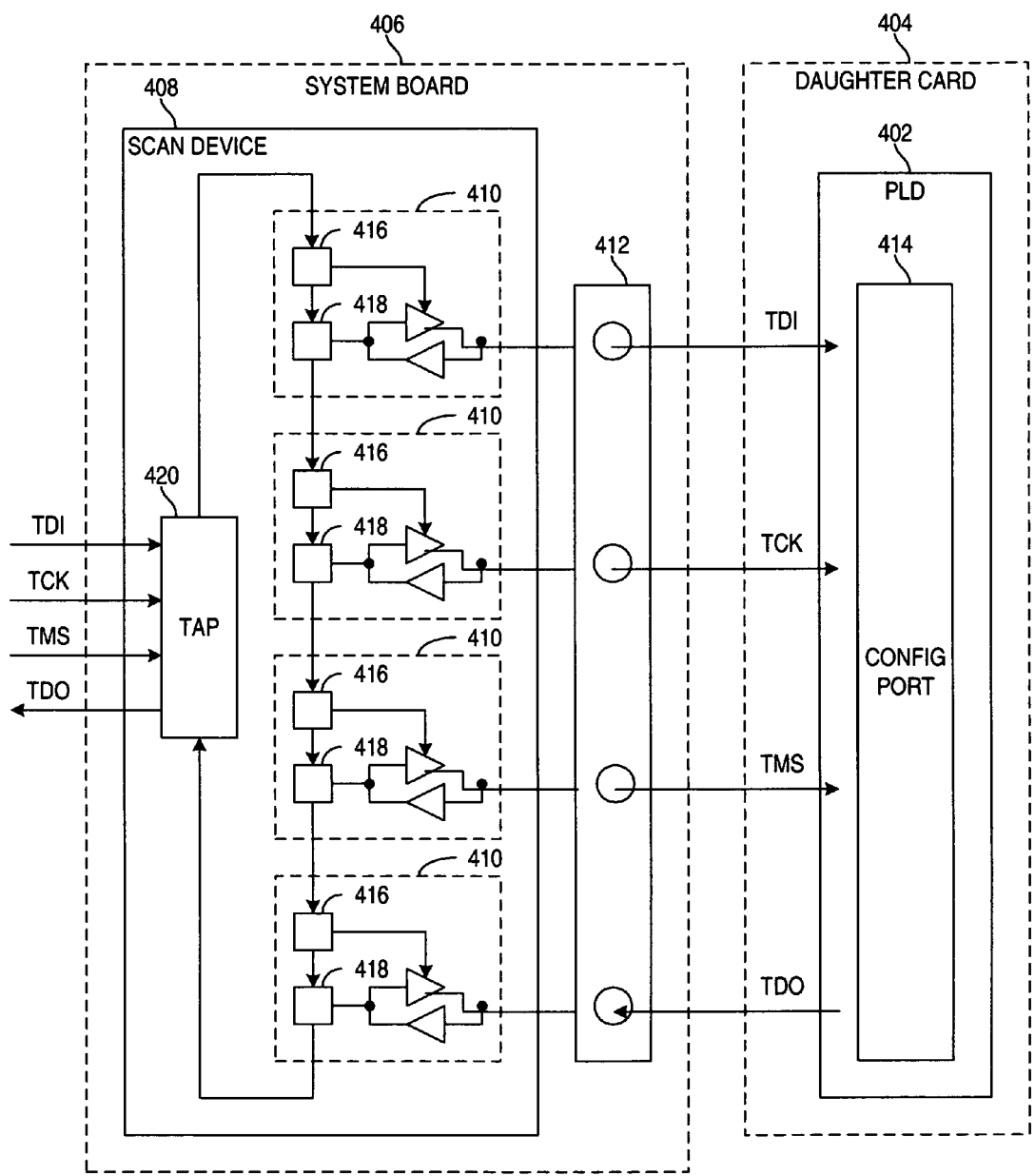
FIG. 4 is block diagram of an example circuit for configuration access to a PLD on a daughter card via boundary-scan in accordance with various embodiments of the invention.

FIG. 4 is block diagram of an example circuit for configuration access to a PLD 402 on a daughter card 404 via boundary-scan in accordance with various embodiments of the invention. A system board 406 may include a scan device 408 having pads 410 connected via scannable pins of scan device 408 to a connector 412, which may be used to connect the daughter card 404.

The system board 406 may have a scan chain that may be expanded to include devices on the daughter card 404, such as PLD 402. The expanded scan chain may be used for configuration access to PLD 402 of daughter card 404. Generally, switches or jumpers are required on system board 406 to provide a scan chain that may include an optional daughter card 404. Providing correct settings for switches or jumpers are problematic and improper settings or improper seating of daughter card 404 in connector 412 may cause a malfunction such as rendering the entire scan chain inoperable. In addition, defects in the system board 406, the daughter card 404, connector 412, and related components may cause malfunction.

In contrast, embodiments of the invention permit configuration access to PLD 402 of daughter card 404 without the possibility of a scan chain for the system board 406 being rendered inoperable due to improper settings of switches or jumpers or due to improper seating of daughter card 404 in connector 412. In addition, embodiments of the invention may be provided in parallel to a scan chain of system board 406 that may be expanded to include devices on the daughter card 404, such as PLD 402. The approaches for scan-based configuration of a PLD as illustrated in FIGS. 1, 2, 3, and 4 may be used in various combinations to provide multiple access paths to a configuration port of PLD 402, and support debugging of problems associated with the access path that uses the scan chain.

The daughter card 404 may be designed after the design for the system board 406 has been finalized. The finalized design for system board 406 may not directly enable an access path to the PLD 402 of daughter card 404 because no configuration port signals are available at connector 412. Connector 412 may include signals coupled to a scan device 408 that supports boundary-scan. By designing daughter card 404 to couple the configuration port 414 of PLD 402 to signals of connector 412 that are coupled to a scan device 408, various embodiments of the invention may be used for configuration access to PLD 402.

In one embodiment, the system board 406 contains a scan device 408 that is a PLD having general purpose I/O pads 410 that may be configured to be either an input pad or an output pad. Each pad 410 includes two boundary-scan registers 416 and 418 with boundary-scan register 416 controlling the direction of transfer of a bit of data held in boundary-scan register 418. A PRELOAD or an EXTEST instruction for TAP 420 may simultaneously provide configuration data for a configuration access to PLD 402 of daughter card 404 and set the direction for data transfer with the value of boundary-scan registers 416.

It will be appreciated that configuration access to PLD 402 of daughter card 404 may be provided by coupling the signals for any configuration protocol supported by PLD 404 to signals of connector 412 that are coupled to one or more scan devices that support boundary-scan.

Figure 5:
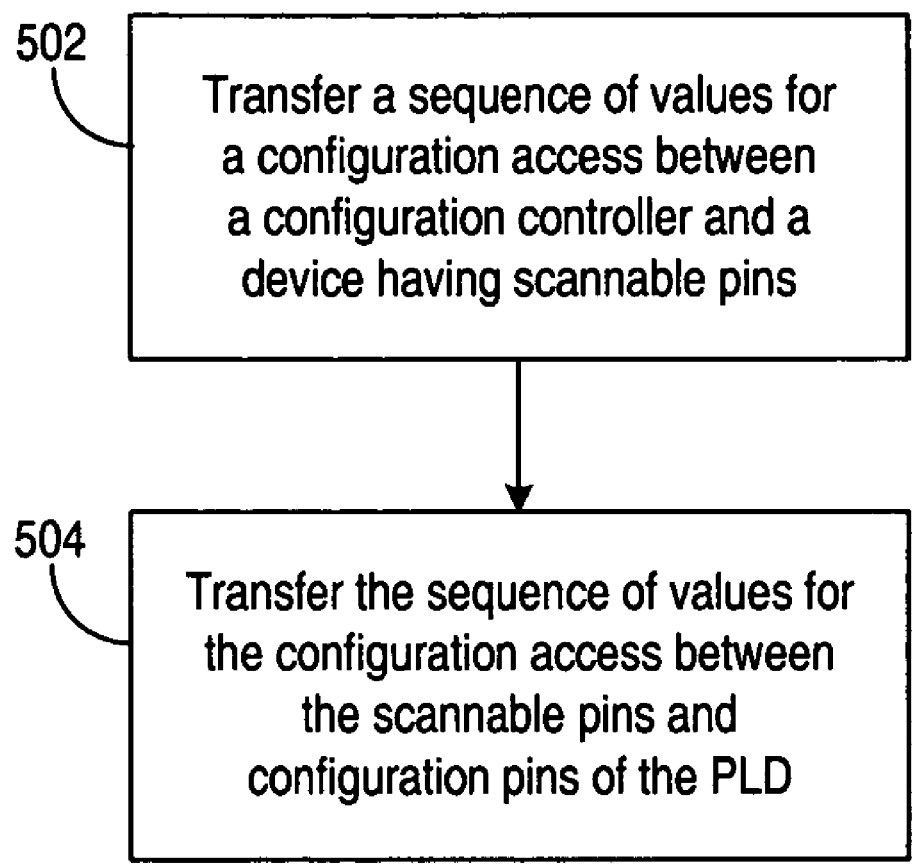
FIG. 5 is a flow diagram of a process for configuration access to a PLD via boundary-scan in accordance with various embodiments of the invention.

FIG. 5 is a flow diagram of a process for configuration access to a PLD via boundary-scan in accordance with various embodiments of the invention.

At step 502, the values specifying a configuration access are transferred between a configuration controller and a device supporting boundary-scan. Depending upon the configuration access, values specifying the configuration access may be transferred from the configuration controller to the device, from the device to the configuration controller, or both. The values specifying the configuration access may be transferred first to a scan controller that in turn transfers the values specifying the configuration access to the device supporting boundary-scan using an IEEE 1149.1 boundary-scan protocol.

At step 504, the value specifying the configuration access are transferred between certain pins of the device supporting boundary-scan and a configuration port of the PLD. Thus, boundary-scan of the device is used to transfer values specifying the configuration access between the configuration controller and the configuration port of the PLD.

The present invention is believed to be applicable to a variety of systems for configuring PLDS and has been found to be particularly applicable and beneficial in systems having boundary-scannable devices. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A system providing configuration access, comprising:
    an integrated circuit (IC) having programmable logic and a configuration port that includes a plurality of configuration pins;
    wherein the configuration pins are coupled to the programmable logic;
    a configuration controller arranged to transfer configuration data that specify configuration access for the IC;
    wherein the configuration access includes programming the programmable logic of the IC to perform a function;
    a first scan controller coupled to the configuration controller, the first scan controller arranged to generate boundary-scan signals responsive to configuration data from the configuration controller;
    wherein the configuration controller and first scan controller are external to the IC;
    at least one boundary-scannable device having a plurality of boundary-scan pins coupled to the first scan controller; and
    wherein each configuration pin of the IC is coupled to a respective one of the boundary-scan pins of the at least one boundary-scannable device.

2. The system of claim 1, further comprising a plurality of boundary-scannable devices coupled in a single scan chain to the first scan controller, wherein the at least one boundary-scannable device is part of the plurality of boundary-scannable devices.

3. The system of claim 1, further comprising a plurality of boundary-scannable devices coupled in a plurality of scan chains to the first scan controller, wherein the at least one boundary-scannable device is part of the plurality of boundary-scannable devices.

4. The system of claim 1, further comprising:
    a plurality of scan controllers coupled to the configuration controller; and
    a plurality of boundary-scannable devices coupled in a plurality of scan chains, each scan chain coupled to a respective scan controller of the plurality of scan controllers and of the first scan controller, wherein the at least one boundary-scannable device is part of the plurality of boundary-scannable devices.

5. The system of claim 1, wherein the configuration port of the IC includes a configuration register coupled to the configuration pins, and the first scan controller is adapted to read data from the configuration register via the boundary-scan pins of the boundary-scannable device in response to configuration data from the configuration controller indicating read access to the IC.

6. The system of claim 5, wherein the first scan controller is adapted to write data to the configuration register via the boundary-scan pins of the boundary-scannable device in response to configuration data from the configuration controller indicating write access to the IC.

7. The system of claim 6, further comprising a multiplexer circuit having a plurality of output pins coupled to respective the configuration pins of the IC, a first plurality of input pins coupled to respective ones of the boundary-scan pins, and a second plurality of input pins, the multiplexer circuit adapted to select between signals at the first plurality of input pins and signals at the second plurality of input pins in response to a control signal from one of the boundary-scan pins;
    wherein the second plurality of input pins is coupled to circuitry for providing alternative signals to signals provided from the boundary scan pins to the first plurality of input pins.

8. The system of claim 6, further comprising:
    a daughter card having the IC mounted thereon;
    a system board having the at least one boundary-scannable device mounted thereon and including a connector connected to the daughter card, wherein each configuration pin of the IC is coupled to the respective one of the boundary-scan pins via the connector.

9. The system of claim 6, wherein the configuration port implements at least one of a serial configuration protocol and a parallel configuration protocol.

10. The system of claim 1, further comprising a multiplexer circuit having a plurality of output pins coupled to respective the configuration pins of the IC, a first plurality of input pins coupled to respective ones of the boundary-scan pins, and a second plurality of input pins, the multiplexer circuit adapted to select between signals at the first plurality of input pins and signals at the second plurality of input pins in response to a control signal;
    wherein the second plurality of input pins is coupled to circuitry for providing alternative signals to signals provided from the boundary scan pins to the first plurality of input pins.

11. The system of claim 10, wherein the control signal is provided from one of the boundary-scan pins.

12. The system of claim 1, further comprising:
    a daughter card having the IC mounted thereon;
    a system board having the at least one boundary-scannable device mounted thereon and including a connector connected to the daughter card, wherein each configuration pin of the IC is coupled to the respective one of the boundary-scan pins via the connector.

13. The system of claim 1, wherein the configuration port implements at least one of a serial configuration protocol and a parallel configuration protocol.

14. A method for configuration access to an integrated circuit (IC) having programmable logic, comprising:
    transferring configuration data specifying the configuration access between a configuration controller and at least one boundary-scannable device having boundary-scan pins;
    wherein the configuration access is for the programmable logic on the IC;

wherein the transferring between the configuration controller and the boundary-scannable device includes, transferring the configuration data between the configuration controller and a scan controller, generating by the scan controller boundary-scan signals responsive to configuration data from the configuration controller, and transferring the configuration data between the scan controller and the boundary-scannable device via application of the boundary-scan signals;

wherein the configuration controller and scan controller are external to the IC;

transferring the configuration data between the boundary-scan pins of the boundary-scannable device and configuration pins of the IC; and programming the programmable logic of the IC to perform a function in response to the configuration data received at the configuration pins of the IC.

15. The method of claim 14, wherein the IC includes a configuration register coupled to the configuration pins, and further comprising reading data from the configuration register via the boundary-scan pins of the boundary-scannable device in response to configuration data from the configuration controller indicating read access to the IC.

16. The method of claim 15, further comprising writing data to the configuration register via the boundary-scan pins of the boundary-scannable device in response to configuration data from the configuration controller indicating write access to the IC.

17. The method of claim 16, further comprising:

loading a first operation code in the boundary-scannable device, and in response to the first operation code, loading configuration data at a first subset of boundary-scan pins; and loading a second operation code in the boundary-scannable device, and in response to the second operation code, driving signals at first subset of the boundary-scan pins.

18. The method of claim 17, further comprising, in response to the second operation code, reading signals at a second subset of the boundary-scan pins.

19. The method of claim 17, further comprising, loading a third operation code in the boundary-scannable device, and in response to the third operation code reading signals at a second subset of the boundary-scan pins.

20. An apparatus for configuration access to an integrated circuit (IC) having programmable logic, comprising:

means for transferring configuration data specifying the configuration access between a configuration controller and at least one boundary-scannable device having boundary-scan pins;

wherein the configuration access is for the programmable logic on the IC;

wherein the means for transferring between the configuration controller and the boundary-scannable device includes, means for transferring the configuration data between the configuration controller and a scan controller, means for generating boundary-scan signals responsive to configuration data from the configuration controller, and means for transferring the configuration data between the scan controller and the boundary-scannable device via application of the boundary-scan signals;

wherein the configuration controller and scan controller are external to the IC;

means for transferring the configuration data between the boundary-scan pins of the boundary-scannable device and configuration pins of the IC; and means for programming the programmable logic of the IC to perform a function in response to the configuration data received at the configuration pins of the IC.

\* \* \* \* \*